(12) United States Patent
Ishizaki et al.

(10) Patent No.: US 6,949,970 B2
(45) Date of Patent: Sep. 27, 2005

(54) VOLTAGE STANDARD APPARATUS

(75) Inventors: Mayumi Ishizaki, Ibaraki (JP);
Hirotake Yamamori, Ibaraki (JP);
Akira Shoji, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 17 days.

(21) Appl. No.: 10/714,920

(22) Filed: Nov. 18, 2003

(65) Prior Publication Data

US 2004/0150462 A1 Aug. 5, 2004

(30) Foreign Application Priority Data

Nov. 18, 2002 (JP) .................................... 2002-333100

(51) Int. Cl.$^7$ ................................................ H03K 3/38
(52) U.S. Cl. ........................................................ 327/528
(58) Field of Search .................................. 327/527, 528

(56) References Cited

U.S. PATENT DOCUMENTS 5,479,131 A    12/1995   Lee
5,565,866 A  * 10/1996   Hamilton et al. ............ 341/133

FOREIGN PATENT DOCUMENTS

DE    40 29 162 A1    3/1992
DE    198 01 658 C1    2/1999

OTHER PUBLICATIONS

European Search Report for EP 03 25 5341 completed on Nov. 5, 2004.
Burroughs C. J. et al.: "Programmable 1 Volt DC Voltage Standard" Precision Electromagnetic Measurements Digest, 1998 Conference on Washington, DC, USA Jul. 6–10, 1998, New York, NY, USA, IEEE, US, Jul. 6, 1998, pp. 548–549.

* cited by examiner

*Primary Examiner*—Jeffrey Zweizig
(74) *Attorney, Agent, or Firm*—Rader, Fishman & Grauer PLLC

(57) ABSTRACT

A programmable voltage standard element which consists of Josephson junction arrays having Josephson junction devices which are connected in series generates constant voltage by impression of bias current and microwave.

The voltage standard element has bias current terminals each of which is provided for a respective section comprising a Josephson junction devices of in-series connection that are divided by the number of the nth power of 3. A bias current supply circuit independently impresses bias current of a predetermined value to a bias current terminal for every section. A controlling circuit controls a bias current supply circuit to impress bias current of a predetermined value to a Josephson junction array of each section and control impression of microwave.

3 Claims, 3 Drawing Sheets

PRIOR ART

VOLTAGE STANDARD APPARATUS

TECHNICAL FIELD OF THE INVENTION

This invention relates to a voltage standard apparatus using a voltage standard element(s) which comprises a Josephson junction array(s) in which a plurality of Josephson junction devices are in-series connected, each of which generates constant voltage by impression of bias current and microwave.

DESCRIPTION OF RELATED ART

It has been reported that a programmable voltage standard element using the Josephson junction devices of an binary code arrangement which at high speed outputs arbitrary voltage within the maximum output voltage has been developed, wherein a Josephson junction array(s) in which a plurality of Josephson junction devices are in series connected is used. See C. A. Hamilton, C. J. Burroughs, and R. J. Kauts *Josephson D/A Converter with Fundamental Accuracy, IEEE Transaction.Instrumentation and Measurement*, Vol. 44, No. 2, pp. 223–225, (April 1995).

FIG. 4 is a schematic view explaining the structure of the conventional programmable voltage standard element having the Josephson junction array in which a plurality of the Josephson junction devices are in series connected.

In the programmable voltage standard element shown in FIG. 4, it is theoretically possible to programmably generate desired voltage by on/off-controlling voltage generated on the Josephson junction array since the Josephson junction devices generate constant voltage by impressing bias current and microwave.

(a) The Josephson junction devices which are in series connected are divided (grouped) into sections 1, 2, 3, 4, . . . based on binary digit segmentation (segmentation based on the nth power of 2).

(b) Two or more terminals 6 for passing bias current for every section are provided.

(c) Combined positive bias current and zero bias current or combined negative bias current and zero bias current is independently applied from the terminals 6 to the respective sections.

(d) Thus it is possible to output arbitrary output voltage between the positive maximum output voltage value upon impression of positive bias current on all the sections, and the negative maximum output voltage value upon impression of negative bias current on all the section, with the highest resolution having the minimum output voltage that is equal to that obtained from the section having the minimum number of the Josephson junctions device(s) grouped based on the binary digit segmentation.

In FIG. 4, microwave(s) is applied to a microwave input terminal 5. A microwave terminal resistance 7 is used for impression of the microwave(s). The output voltage is obtained from an output voltage terminal 8. A capacitor(s), a low-pass filter(s) etc. are provided for separating an AC circuit for impressing microwave and a DC circuit for impressing bias current from each other. The capacitor(s), the low-pass filter(s) etc. are not illustrated.

The programmable voltage standard element is configured so that the circuit chip thereof comprises a plurality of the Josephson junction devices directly connected, electric signal wiring and terminals for external input and output etc., are integrated.

In such a case, it is necessary to form, in the chip, many Josephson junction devices which are in series connected by keeping the number of the signal wiring, terminals etc. which takes up much area in the chip which forms the integrated circuit as small as possible.

Such a programmable voltage standard element has characteristic that, when the microwave(s) of frequency "f" is applied to both the electrodes of the Josephson junction, step current appears therebetween at intervals of constant voltage V=f (h/2e) wherein "h" represents the Planck's constant and "e" represents a unit electric charge constant. The programmable voltage standard element generates constant voltage by using the characteristic of the Josephson junction.

For this reason, in order to output one (1) volt as standard voltage, a plurality of Josephson junctions integrated in the chip are necessary. Supposing the value of microwave frequency is, for example, around f=16 GHz, from the ease of treating, the voltage generated per Josephson junction is about 33 microvolts ($\mu$V), and to obtain the output voltage of 1 V, about 30,000 Josephson junctions are necessary.

When voltage is programmably generated by a programmable voltage element having 8 bit voltage resolution and the junction unit comprises 128 junctions to generate the voltage of the minimum bit, the number of junction of the whole Josephson junctions is 32,768.

FIG. 5 is a schematic view explaining the structure of the programmable voltage standard element using the Josephson junction array of binary code arrangement.

The programmable voltage standard element of the one volt output chip that has been developed and reduced into practice will be used to explain the structure thereof as an example below.

As shown in FIG. 5, a section for generating the minimum bit voltage comprises not one Josephson junction but 128 junctions, and from the minimum section, about 4 mV is output.

The number of terminals for the wiring including the terminal for inputting microwave(s) is nine, which take up a large space within the chip. Thus it has an 8-bit structure.

In such a programmable voltage standard element, in order to improve the resolution of output voltage, it is necessary to increase the number of terminals for wiring, but it is not practical to increase the number of the terminals since the terminals for wiring take up a large space inside the chip. Therefore, the output voltage resolution of the conventional programmable voltage standard element is low.

SUMMARY OF THE INVENTION

For this reason, in case of developing the voltage standard element which outputs ten Volt (10 V), for example, the large-scale Josephson junction array in which a plurality of Josephson junctions are in series connected is integrated.

Therefore, it is required to allocate a large area of the chip to the Josephson junction array and also to reduce the number of the terminals that take up a large space.

Thus, if the resolution can be improved without increasing the number of terminals in case of creating a programmable voltage standard element, it will be advantageous in reducing to practice.

It is an object of the present invention to reduce the number of terminals of programmable voltage standard element comprising a Josephson junction array for generating constant voltage by impressing bias current and microwave(s), in which a plurality of Josephson junctions are in series connected.

It is another object of the present invention to provide a high voltage standard apparatus having high output voltage resolution.

According to the present invention, a voltage standard apparatus using a voltage standard element comprising a Josephson junction array, the voltage standard apparatus comprises Josephson junctions for generating constant voltage by impressing bias current and microwave, wherein the Josephson junction devices are grouped into sections based on the nth power of 3, wherein at least one bias current terminal is provided for each of the sections, a bias current supplying circuit for independently impressing bias current having predetermined value to the bias current terminals, and a controlling circuit for impressing predetermined bias current to the sections of Josephson junction array and controlling impression of microwave.

Further, the voltage standard apparatus may include a binary/ternary code converter wherein the controlling circuit is operated by binary code.

Furthermore, the binary/ternary code converter may be provided in the controlling circuit.

Thus, according to the present invention, in the voltage standard equipment which has such a feature, the programmable voltage standard element has the Josephson junction array that has bias current terminals provided for respective sections which comprise Josephson junction devices of in-series connection, wherein the sections comprises junctions are divided by the nth power of 3. Further, the bias current supplying circuit independently impresses predetermined bias current to the bias current terminal(s) of each section. Furthermore, the controlling circuit impresses predetermined bias current to each section of Josephson junction array by controlling the bias current supplying circuit, and controls impression of microwave. Therefore, it is possible to generate programmed standard voltage corresponding to the ternary digital code by control of the controlling circuit.

A programmable voltage standard element having Josephson junction array used in a conventional voltage standard apparatus is compatible with binary digital code, and the number of Josephson junction terminals for digital/analog conversion corresponds to the number of sections of the array divided according to binary digital code.

For this reason, voltage output resolution depends on the number of terminals and the binary digital code. This is because the bias current impressed to the programmable voltage standard element comprises a combination of positive and negative, or negative and zero.

In the voltage standard apparatus according to the present invention, the bias current comprises a combination of three kinds of bias current (e.g. positive, zero and negative) and is impressed from the bias current terminals of the programmable voltage standard element of the Josephson junction array, and instead of the binary digital code, the ternary digital code is used.

Thereby, as the programmable voltage standard element of Josephson junction array, the bias current terminals are provided for respective sections comprising Josephson junction devices connected in series in the Josephson junction array, which are divided by the number of the nth power of 3. Accordingly, high voltage output resolution is obtained in spite of fewer bias current terminals.

Moreover, corresponding to a case where standard voltage programmed according to the binary digital code is generated, the controlling circuit is equipped with a code conversion apparatus which converts binary code into ternary code. Thereby, standard voltage programmed according to the binary digital code is generated by converting the binary code to the ternary code by the code conversion equipment.

Thus, since resolution of output voltage can be improved without increasing the number of terminals in a chip which performs digital analog conversion, a voltage standard apparatus with high resolution can be provided.

DESCRIPTION OF THE DRAWINGS

The present inventions will now be described by way of example with reference to the following figures in which.

DETAILED DESCRIPTION OF THE INVENTION

An embodiment of the present invention is described below with reference to a drawing.

Figure 1:
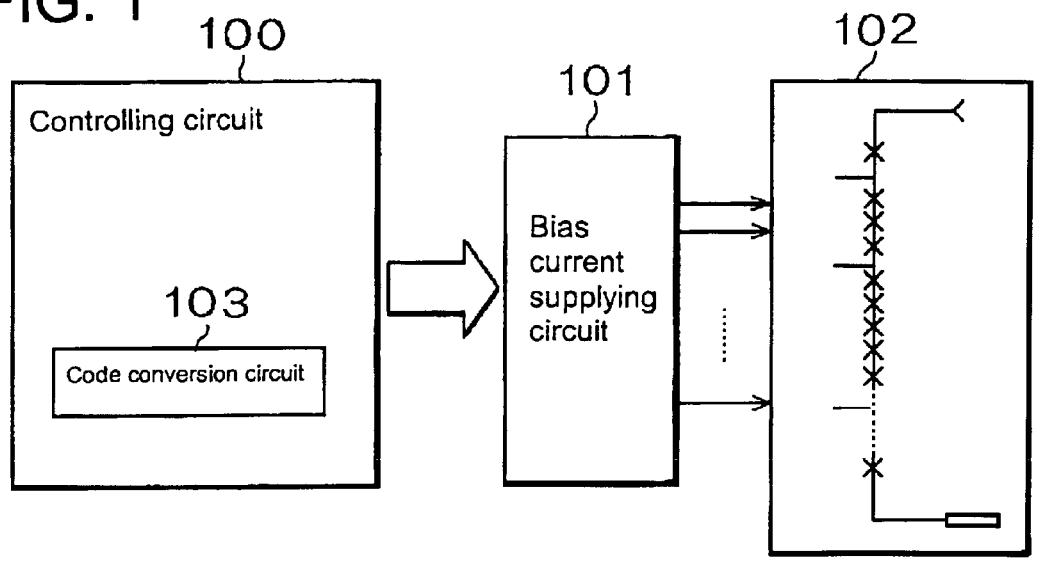
FIG. 1 is a block diagram showing the principal part of a voltage standard apparatus according to the present invention.

FIG. 1 is a block diagram showing the principal part of the voltage standard apparatus according to the present invention.

As shown in FIG. 1, the voltage standard apparatus mainly comprises a controlling circuit 100 having a code conversion circuit 103, a bias current supplying circuit 101, and a programmed voltage standard element 102 of a Josephson junction array.

The programmable voltage standard element 102 comprises sections in which Josephson junction devices in the Josephson junction array connected in series are grouped based on the nth power of 3, as described later, each of which has a bias current terminal. The bias current supplying circuit 101 independently impresses predetermined bias current to selected bias current terminals of the programmable voltage standard element 102. Thereby, predetermined constant voltage corresponding to a ternary code is generated independently for every section.

For this reason, the controlling circuit 100 controls impression of microwave to the programmable voltage standard element 102 and also controls the bias current supplying circuit 101 so as to control to impress the bias current having a predetermined value independently to the Josephson junction array for every section corresponding to ternary code.

Moreover, the controlling circuit 100 includes the code conversion circuit 103, that converts the binary code into the ternary code, and controls the bias current of the bias current supplying circuit 101.

Thus, according to the present embodiment, the voltage standard element comprises Josephson junction array having a plurality of the Josephson junctions connected in series in which constant voltage corresponding to ternary code is generated by the impression of the bias current and microwave.

Next, the structure of the voltage standard element will be explained.

Figure 2:
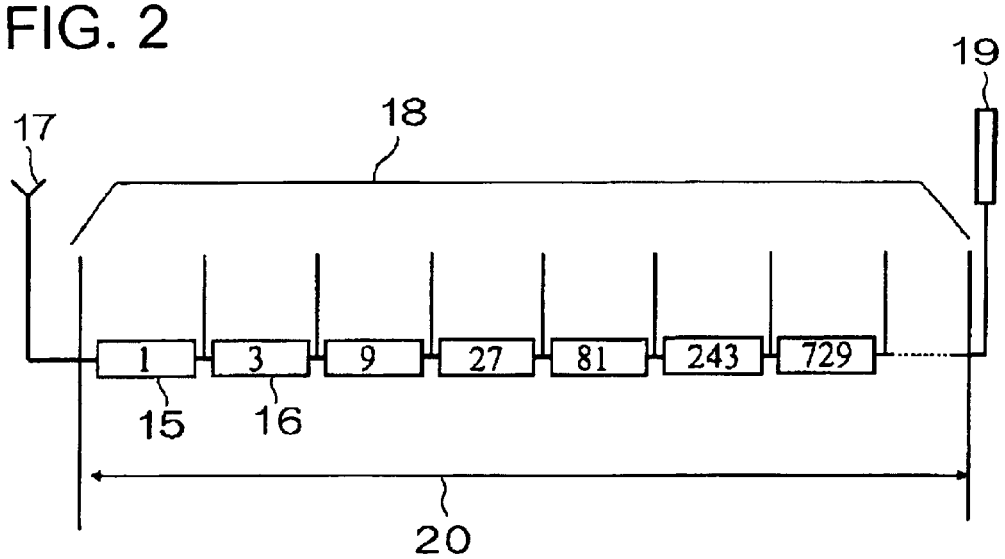
FIG. 2 is a schematic view explaining the structure of the programmable voltage standard element having the Josephson junction array based on ternary code.

FIG. 2 is a schematic view explaining the structure of the programmable voltage standard element having the Josephson junction array according to the ternary code.

In FIG. 2, the structure of the programmable voltage standard element used in the embodiment of the present invention, having the Josephson junction array in which a plurality of the Josephson junctions are in series connected is shown.

As shown in FIG. 2:

(a) The Josephson junction devices which are in series connected are separated (divided) into sections 15, 16, . . . based on terminary digit segmentation (segmentation based on the nth power of 3);

(b) Terminals 18 for passing bias current for sections are provided;

(c) Predetermined bias current is independently impressed from the terminals 18 to the respective sections. Thereby, constant voltage corresponding to ternary code by bias current passing through respective sections is generated;

(d) Thus it is possible to output arbitrary output voltage between the positive maximum output voltage value upon impression of positive bias current on all the sections and the negative maximum output voltage value upon impression of negative bias current on all the section, with the minimum resolution output voltage that is equal to output voltage obtained from the section having the minimum number of the Josephson junction devices grouped based on the ternary digit segmentation;

Moreover, FIG. 2 shows a microwave input terminal 17 to impress microwave, a microwave terminal resistance 19 for impression of microwave, and an output voltage terminal 20 for obtaining output voltage.

A capacitor(s), a low-pass filter(s) etc. are provided to separate an AC circuit for impressing microwave and a DC circuit for impressing bias current from each other. The capacitor(s), the low-pass filter(s) etc. are not illustrated.

Theoretically, as mentioned above, in such a programmable voltage standard element, when the microwave of frequency "f" is applied to both the electrodes of the Josephson junction, step current will appear at intervals of constant voltage V=f (h/2e) wherein "h" represents the Planck's constant and "e" represents a unit electric charge constant. The constant voltage is generated by using such characteristic. That is, step current is changed by applying microwave to the Josephson junction, and controlling bias current thereto, and the characterisic that "constant voltage $V_n$=nNf (h/2e) is generated" (n is an integer and N is the number of junctions) in each section is used.

Here, in case that three values are n=0, n=1, and n=-1, constant voltage $V_n$ (that is, $V_0$, $V_1$, $V_{-1}$) respectively is generated by controlling the bias current based on the ternary code.

The total of constant voltage $V_n$ in all the sections becomes the output voltage of the voltage standard element.

Thus, it is possible to carry out large-scale integration by decreasing the number of terminals for bias current impression, but with the same voltage resolution since the Josephson junction array of the programmable voltage standard element is divided into the sections based on ternary code (the nth power of 3) and bias current is selectively impressed to the sections.

Moreover if the Josephson junction array has the same number of terminals as the conventional Josephson junction array, voltage resolution is dramatically improved.

Figure 3:
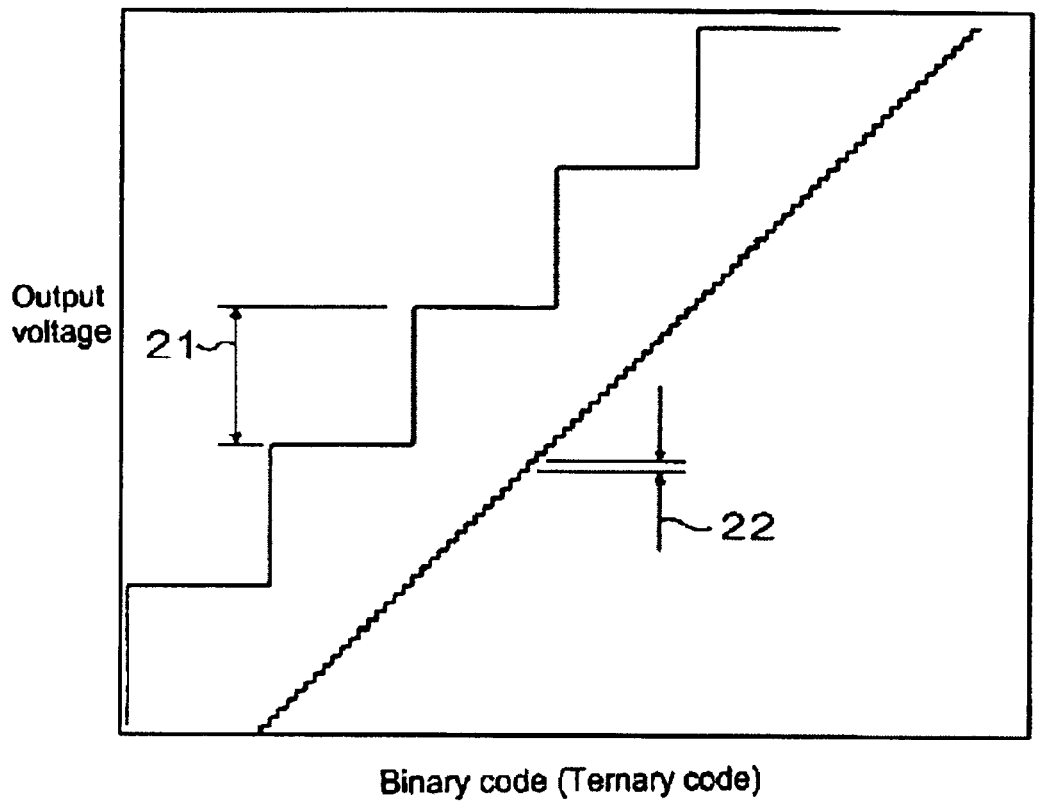
FIG. 3 is a graph for comparing the resolution of a digital analog conversion converter which has a junction array corresponding to ternary code according to the present invention with the resolution of a digital analog conversion converter which has an array corresponding to the conventional binary code junction.
Figure 4:
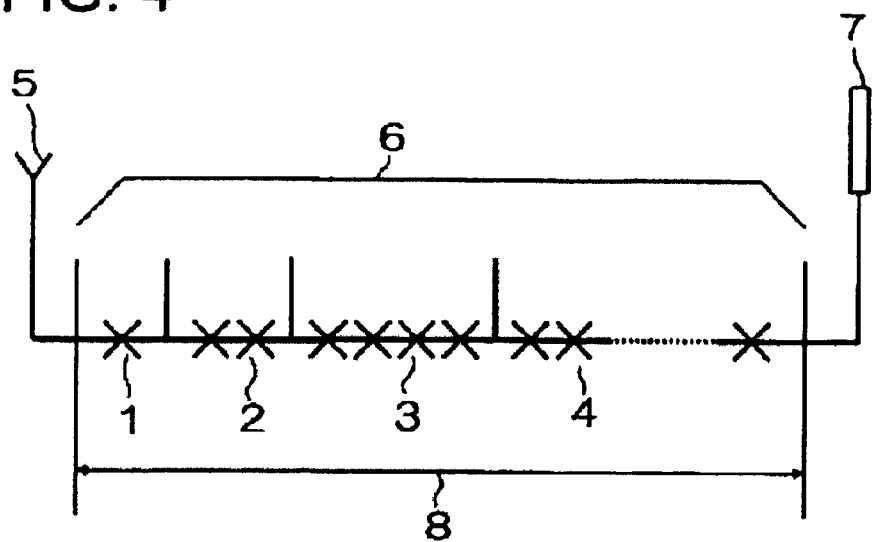
FIG. 4 is a schematic view explaining the structure of the conventional programmable voltage standard element having the Josephson junction array in which a plurality of the Josephson junction devices are in series connected.
Figure 5:
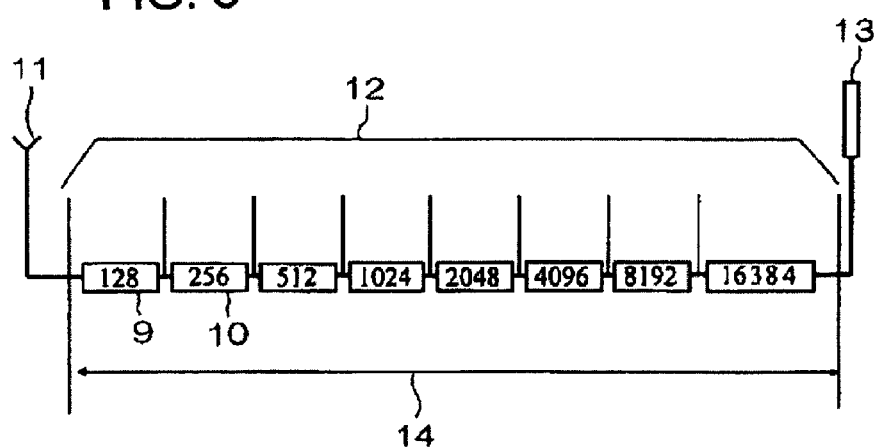
FIG. 5 is a schematic view explaining the structure of the programmable voltage standard element using the Josephson junction array according to binary code.

For example, in comparison to the structure which carries out 10 bit digital analog conversion, as shown in FIG. 3, voltage resolution is dramatically improved FIG. 3 is a graph for comparing with the resolution of a digital analog converter which has a junction array corresponding to ternary code according to the present invention to the resolution of a digital analog conversion converter which has an array corresponding to the conventional binary code junction.

In FIG. 3, the output voltage resolution of the minimum bit in binary code is shown as 21, and the output voltage resolution of the minimum bit in ternary code is shown as 22.

As described above, the programmable voltage standard element outputting about one (1) voltage comprises 32,768 Josephson junctions. When the programmable voltage standard element comprising 32,768 Josephson junctions is formed to adopt the binary code of 10 bits, the number of the sections is 10, that is, the number of the junctions of each section is 32, 64, 128, 256, 512, 1,024, 2,048, 4,096, 8,192, and 16,382, respectively. In such case, the output voltage resolution of Josephson junction element having 32,768 junctions, is 1 mV as shown as 21 in FIG. 3, that is equal to output the total voltage of 32 Josephson junctions.

Since the programmable voltage standard element for outputting about one voltage (1 V) according to the present invention is configured to adopt the ternary code, the number of the sections is 10 and the number of junctions of each section is 1, 3, 9, 27, 81, 243, 729, 2,187, 6,561, and 19,683 respectively. The output voltage of the least bit of the Josephson junction element having 29,524 Josephson junctions, that is, output voltage resolution, is 33 $\mu$V that is equal to output voltage of the least section (one Josephson junction device output voltage) as shown as 22 in FIG. 3.

As explained above, it is possible to decrease the number of terminals for digital/analogue conversion inside the chip and it is possible to improve the output voltage resolution of the digital/analogue converter without increasing the number of the terminals. Furthermore, the voltage standard apparatus according to the present invention is capable of generating high accuracy voltage having high output voltage resolution, thereby significant contribution to the industries is expected.

The disclosure of Japanese Patent Application No. 2002-333100 filed on Nov. 18, 2002 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A voltage standard apparatus using a voltage standard element comprising a Josephson junction array, the voltage standard apparatus comprising:

Josephson junction devices for generating constant voltage by impressing bias current and microwave, wherein the Josephson junction devices are grouped into sections based on the nth power of 3, wherein at least one bias current terminal is provided for each of the sections;

a bias current supplying circuit for independently impressing bias current having predetermined value to the bias current terminals; and a controlling circuit that controls the bias current supplying circuit, so that said bias current supplying circuit impresses the predetermined bias current to the sections of Josephson junction array and controlling impression of microwave.

2. The voltage standard apparatus according to claim 1, further including a binary/ternary code converter wherein the controlling circuit is operated by binary code.

3. The voltage standard apparatus according to claim 2, wherein the binary/ternary code converter is provided in the controlling circuit.

* * * * *